Figure 1:
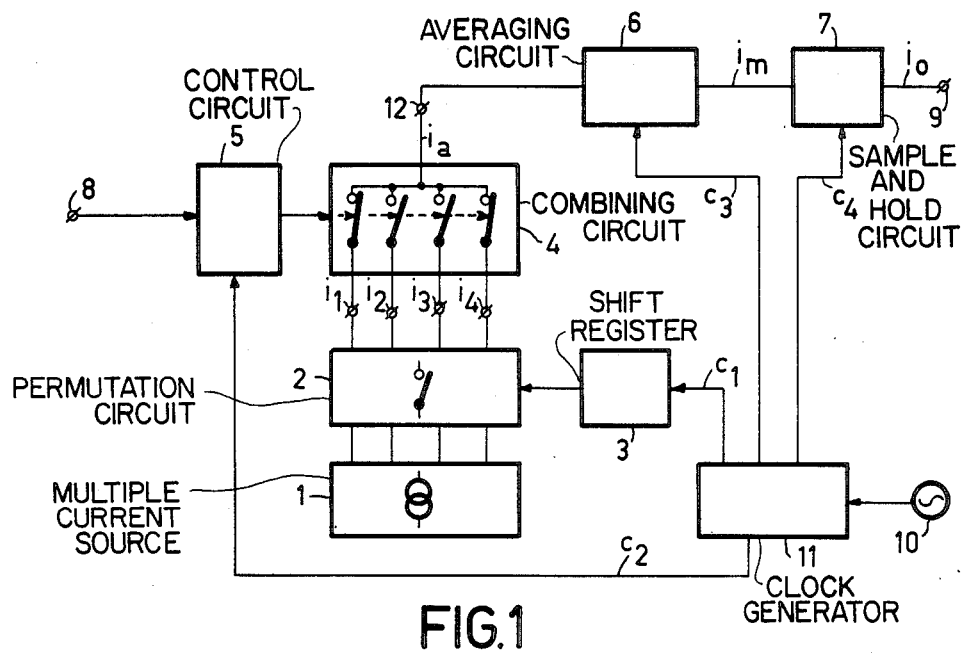

United States Patent [19]

van de Plassche

[11] Patent Number: 4,703,310
[45] Date of Patent: Oct. 27, 1987

[54] DIGITAL/ANALOG CONVERTER WITH CAPACITOR-FREE ELIMINATION OF A.C. COMPONENTS

[75] Inventor: Rudy J. van de Plassche, Eindhoven, Netherlands

[73] Assignee: U.S. Philips Corporation, New York, N.Y.

[21] Appl. No.: 271,315

[22] Filed: Jun. 8, 1981

[30] Foreign Application Priority Data

Jul. 9, 1980 [NL] Netherlands .......................... 8003948

[51] Int. Cl.$^4$ ............................................. H03M 1/66
[52] U.S. Cl. .............................. 340/347 DA; 323/317; 340/347 CC; 340/347 M; 340/347 SH
[58] Field of Search .... 340/347 M, 347 DA, 347 NT, 340/347 CC; 323/317

[56] References Cited

U.S. PATENT DOCUMENTS

| | | | |
|---|---|---|---|
| 3,051,938 | 8/1962 | Levy | 340/347 DA |
| 3,541,446 | 11/1970 | Prozeller | 340/347 NT |
| 3,982,172 | 9/1976 | van de Plassche | 323/317 |
| 4,125,803 | 11/1978 | van de Plassche | 323/317 |

OTHER PUBLICATIONS

Millman et al, Pulse and Digital Circuits, McGraw-Hill Book Co., Inc., 1956, pp. 22-37; 40-47.
Schmid, Electronic Analog/Digital Conversions, Van Nostrand Reinhold Co., 1970, pp. 168-179; 240-247.
The Engineering Staff of Analog Devices, Inc., Analog-Digital Conversion Handbook, 6/1972, pp. I-8; I-9; II-32 to II-35; II-44; II-45; II-46 to II-49; III-73 to III-83.

Primary Examiner—T. J. Sloyan
Attorney, Agent, or Firm—Robert T. Mayer; Bernard Franzblau

[57] ABSTRACT

A digital-to-analog converter in accordance with the dynamic permutation principle in which a weighted series of accurate reference currents are generated by a cyclic permutation of currents which are equal to each other with a smaller degree of accuracy. The a.c. error component can then be eliminated by averaging the output signal of the converter over one full permutation cycle or an integral multiple thereof so that a signal without the error component is obtained by sampling at the end of every period. The setting of the digital-to-analog converter should not be changed during an averaging period.

8 Claims, 4 Drawing Figures

DIGITAL/ANALOG CONVERTER WITH CAPACITOR-FREE ELIMINATION OF A.C. COMPONENTS

The invention relates to a digital-to-analog converter, of the type comprising
- a current-source circuit for generating a plurality of substantially equal currents,
- a permutation circuit for switching said currents to outputs of said permutation circuit in accordance with a cyclic permutation such that, at said outputs, a plurality of currents are available, having d.c. components that are in an accurate mutual proportion and having an a.c. error component that is determined by the inequality in the currents generated by the current-source circuit,
- an input for receiving a digital input signal,
- an output at which an analog output signal determined by the digital input signal is available, and
- a combining circuit for deriving the analog output signal from the currents available on the outputs of the permutation circuit as a function of the digital input signal.

Such a digital-to-analog converter employs the dynamic permutation principle known from U.S. Pat. No. 3,982,172 and U.S. Pat. No. 4,125,803—which Patents are herewith incorporated by reference. In these devices, currents with an accurate mutual proportion are generated by switching substantially equal currents to outputs in accordance with a cyclic permutation so that the relative error of each of the initial currents, relative to a mean value, appears equally often per cycle in each of the output currents. As a result, each of the output currents exhibits a d.c. component whih is in a very accurate proportion to the mean value of the initial currents and thus to each of the d.c. components of the other output currents. The mutual deviations between the initial currents appear in said output currents as a.c. components, which may be annoying depending on the permutation frequency relative to the highest signal frequency and depending on the mutual proportion of the initial currents.

If said a.c. components are annoying they can be filtered out by adding a filter capacitor to each output of the permutation circuit. Thus, with the aid of the remaining direct currents a digital-to-analog conversion by the combining circuit is possible without any problems. A drawback of such a filtering technique is the use of said capacitors, for example 14 capacitors being media for a 14-bit digital-to-analog converter. In most applications, for example in audio technology, the capacitors should be arranged externally of an integrated circuit incorporating such a digital-to-analog converter, which therefore demands a large number of additional terminals.

It is an object of the invention to provide a digital-to-analog converter in which said annoying a.c. components are eliminated without the addition of capacitors to the outputs of the permutation circuit.

To this end the invention is characterized by
- an averaging circuit for averaging the output signal of the combining circuit over an averaging period which is equal to the said cycle duration or an integral multiple thereof,
- a sampling circuit for sampling the output signal of said averaging circuit at the end of each averaging period, and
- a synchronizing circuit for synchronizing the averaging circuit and the permutation circuit in such a way that said averaging period corresponds to said cycle duration or an integral multiple thereof, and for synchronizing the combining circuit and the averaging circuit in such a way that the setting of the combining circuit is not changed during the averaging period.

The invention is based on the recognition that—although at a first glance filtering at the output of the combining circuit is not possible because cross-modulation components of said a.c. components and the switching transients of the combining circuit may arise within the signal spectrum—said a.c. components can still be eliminated by averaging the output signal of the combining circuit over a period which is equal to the duration of the permutation cycle or an integral multiple thereof, the setting of said combining circuit being maintained within said period.

The invention may further be characterized in that the averaging circuit is an integrator with a reset circuit for resetting said integrator at the end of each averaging period.

This embodiment may further be characterized in that the integrator comprises an operational amplifier with a first capacitor coupled between its input and output, a reset switch bypassing said first capacitor. A second capacitor is provided with a change-over switch for connecting said capacitor to the output of the combining circuit during the averaging period and for connecting said capacitor to the input of said amplifier at the end of each averaging period.

The digital-to-analog converter in accordance with the invention maybe employed in an analog-to-digital converter in which an analog signal current input is connected to the output of the combining circuit. This connector may further comprise an integrating capacitor in parallel with a reset switch connected to the output of the combining circuit and to the input of a comparator which is clocked at the end of each averaging period. The output of said comparator controls a digital signal generator which supplies a ddigital signal to the input of the digital-to-analog converter.

Figure 2:
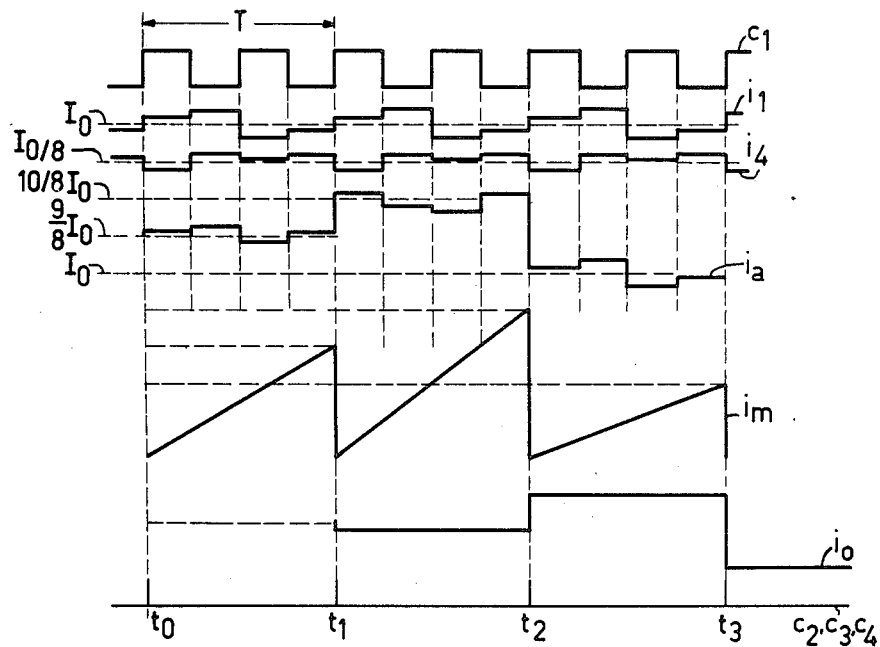
Figure 3:
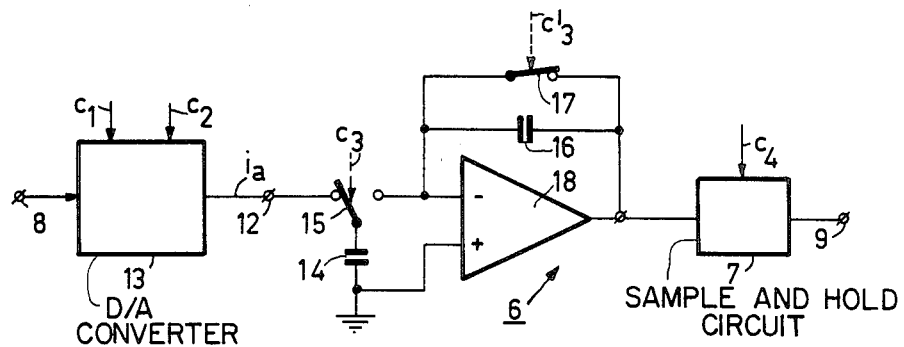
Figure 4:
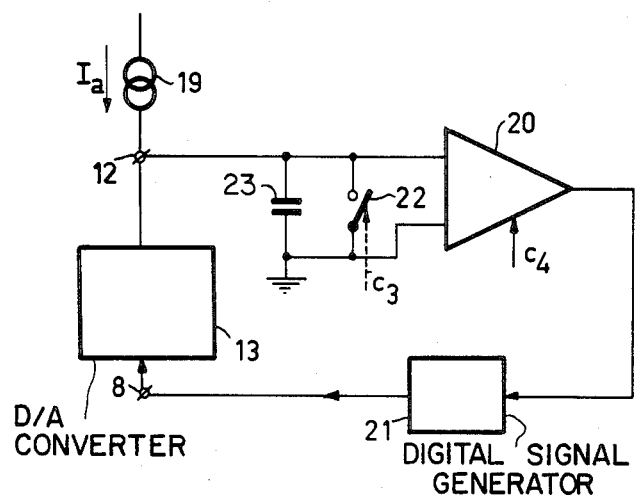

The invention will now be described in more detail with reference to the drawing, in which:

FIG. 1 block-schematically represents the principle of a digital-to-analog converter in accordance with the invention, FIG. 2 shows some signal waveforms to illustrate the operation of the converter represented in FIG. 1, FIG. 3 shows an embodiment of an analog-to-digital converter in accordance with the invention, the averaging circuit 6 being shown in more detail, and FIG. 4 schematically illustrates the use of a digital-to-analog converter in accordance with the invention in an analog-to-digital converter.

FIG. 1 block-schematically represents the principle of a digital-to-analog converter in accordance with the invention, while FIG. 2 shows some signal waveforms to illustrate the operation of the converter shown in FIG. 1.

The converter comprises a generator for generating a plurality of currents which are in an accurate mutual proportion,—in the present example four currents $i_1$, $i_2$, $i_3$ and $i_4$ with, for example, binary weighted values $I_0$, $I_0/2$, $I_0/4$ and $I_0/8$—as is for example described in U.S. Pat. No. 3,982,172 and in U.S. Pat. No. 4,125,803. It is to be noted that it is possible both to employ a single stage and a cascade of such known stages (FIG. 6 of U.S. Pat. No. 3,982,172). In general, the generator comprises a multiple current source 1 which supplies a plurality of substantially equal currents to a permutation circuit 2 which, under control of a circuit 3, for example a shift register, generates a cyclically recurring connecting pattern such that at the outputs thereof the desired currents $i_1, i_2, i_3$ and $i_4$ are available in the desired mutual proportion. This is described comprehensively in the said Patents. In this way the currents $i_1$ to $i_4$ are obtained, the currents $i_1$ and $i_4$ as well as a clock signal $c_1$ which controls the circuit 3 being shown in FIG. 2. In the present example the currents recur every four steps of the permutation circuit 2, which four steps define a cycle duration T. Each of the currents has a desired d.c. component on which an a.c. component is superimposed. The a.c. component is determined by mutual differences of the currents supplied by the current source 1 and has a mean value equal to zero over the cycle duration T.

By means of such a binary weighted sequence of currents digital-to-analog conversion is possible. For this purpose there is provided a combining circuit 4 which, on command of a control circuit 5, to which the digital input signal is applied via input 8, transfers some of the currents $i_1$ to $i_4$ to output 12, on which consequently an analog output current $i_a$ appears. FIG. 2 shows said current $i_a$ when consecutively the digital signals 1001 (FIG. 1 shows the corresponding setting of the combining circuit 4), 1010 and 1000 are converted at the instants $t_0, t_1$ and $t_2$. It is assumed that the control circuit 5 is controlled by a clock signal $c_2$ in such a way that the combining circuit 4 can only change-over at the beginning of each cycle, i.e. in the present example at the instants $t_0, t_1, t_2, t_3$, so that over a cycle T the error component in the output signal $i_a$ has an average value equal to zero.

The output signal $i_a$ is applied to an averaging circuit 6, in the present example an integrator, which after every cycle T is reset to an initial value on command of a clock signal $c_3$. The output signal $i_m$ of said averaging circuit 6 then has a sawtooth waveform as is shown in FIG. 2, with a ripple, which for the sake of simplicity is not shown, and which is caused by the error component, and after every cycle T it has a value as though only the d.c. component ($9/8 I_0$, $10/8 I_0$ and $I_0$ in the present example) were integrated, because the error component has an average value equal to zero over the cycle T. At the end of each cycle, that is at the instants $t_0, t_1, t_2, t_3$, the integrator 6 is reset, but just before this end the final value of each integration cycle is sampled and held by means of a sample and hold circuit 7 on command of the clock signal $c_4$. The output signal $i_0$ at output 9 then corresponds to the signal $i_a$ without the error component and is shifted over one cycle T.

A clock generator 11—for example with an oscillator 10 as a reference—supplies the various clock signals $c_1$ to $c_4$. It is obvious that in practice delays should be provided between the signals $c_1$ to $c_4$, which in FIG. 2 are represented as though they appear simultaneously, for example in order to ensure that sampling is effected before the averaging circuit 6 is reset. For this purpose, a waiting time of for example one period of the clock signal $c_1$ may be inserted between the integrating cycles, if necessary. Furthermore, for the sake of accuracy, averaging over a plurality of cycles may be effected if the available bandwidth permits, in which case the digital data input via the circuit 5, as well as the sampling, can be effected only once per plurality of cycles.

FIG. 3 shows an embodiment of a digital-to-analog converter in accordance with the invention with an example of an averaging circuit 6 shown in more detail. In this Figure the block 13 represents the part of the circuit arrangement of FIG. 1 made up of the circuits 1, 2, 3, 4 and 5. The averaging circuit 6 comprises an operational amplifier 18 with a capacitor 16 between its output and inverting input. The capacitor 16 is bypassed by a reset switch 17 which is activated on command of the clock signal $c_3$. The output 12 of the actual digital-to-analog converter 13 is connected to one pole of a change-over switch 15 which is controlled by a clock signal $c_3$. The other pole of said switch is connected to the inverting input of the amplifier 18 and the common pole is coupled to the non-inverting input of amplifier 18 and to ground. In practice the switches 15 and 17 are generally constituted by switching transistors such as FETS.

During one averaging period T the switches 15 and 17 are in the positions shown. The output current $i_a$ of the digital-to-analog converter 13 then charges capacitor 14, the a.c. component being eliminated if charging is effected for a cycle T. At the end of every cycle the switch 15 changes over and switch 17 opens. By means of the operational amplifier 18 the charge on the capacitor 14 is transferred to capacitor 16 so that at the input of the sample-and-hold circuit 7 a voltage appears which is a measure of the average value of the signal $I_a$ over one cycle T. After the sample-and-hold circuit 7 has taken a sample the switches 15 and 17 are reset to the positions shown and capacitor 16 discharges.

FIG. 4 shows the use of a digital-to-analog converter in accordance with the inventon in an analog-to-digital converter based on the successive-approximation principle. In accordance with this principle the D—A converter 13 receives a digital signal at input 8 and the resulting analog signal at output 12 is compared with the analog signal $I_a$ to be converted by means of a comparator 20, after which, depending on the comparison, the digital signal at input 8 is changed via a digital signal generator 21. This procedure is successively repeated until the digital signal at input 8 most closely approximates the analog signal $I_a$, which digital signal then represents the digital value of the analog signal $I_a$.

The principle in accordance with the invention is applied to this embodiment in that at the input of comparator 20 an integrated capacitance 23 is provided which, after every cycle T, is discharged by means of a switch 22 controlled by the clock signal $c_3$. The comparator 20 then receives the clock signal $c_4$, which ensures that comparison is effected solely at the end of every averaging period.

The averaging period need not be exactly in phase with the permutation cycle—as shown in FIG. 2. The only requirement is that the averaging period has the same duration as the permutation cycle or an integral multiple thereof.

The invention is not limited to the embodiments shown. Realizing an averaging circuit, a sample-and-hold circuit etc. can be effected in accordance with technologies which are known per se.

What is claimed is:
1. A digital-to-analog converter comprising:
   a current-source circuit for generating a plurality of substantially equal currents, a permutation circuit coupled to the current-source circuit for switching said currents to outputs of said permutation circuit in accordance with a cyclic permutation so as to produce at said outputs a plurality of currents having DC components in an accurately defined mutual relationship to one another and with an AC error component determined by an inequality in the currents generated by the current-source circuit, an input for receiving a digital input signal, a combining circuit coupled to said input and to said permutation circuit for deriving, as a function of the digital input signal, an analog output signal from the currents available at the outputs of the permutation circuit, an output terminal coupled to the combining circuit to derive said analog output signal, an averaging circuit coupled to the output terminal for averaging the output signal of the combining circuit over an averaging period, a sampling circuit for sampling the output signal of said averaging circuit at the end of every averaging period, and a synchronizing circuit for synchronizing the averaging circuit and the permutation circuit so that said averaging period corresponds to the cycle duration of the permutation circuit or an integral multiple thereof, and for synchronizing the combining circuit and the averaging circuit so that the setting of the combining circuit is unchanged during an averaging period.

2. A digital-to-analog converter as claimed in claim 1 wherein the averaging circuit comprises an integrator with a reset circuit for resetting said integrator at the end of each averaging period.

3. A digital-to-analog converter as claimed in claim 2, wherein the integrator comprises an operational amplifier having a first capacitor coupled between its input and output, a reset switch bypassing said first capacitor, a second capacitor, a switch for connecting said second capacitor to the output of the combining circuit during the averaging period and for connecting said second capacitor to the input of said amplifier at the end of each averaging period.

4. An analog-to-digital converter comprising, a digital-to-analog converter as claimed in claim 1, a source of analog signal input current coupled to the output terminal of the digital-to-analog converter, an integrating capacitor connected in parallel with a reset switch and coupled to said output terminal and to a input of a comparator, the synchronizing circuit of the digital-to-analog converter supplying clock pulses to the comparator at the end of each averaging period, an output of said comparator controlling a digital signal generator which supplies the digital signal to said input of the digital-to-analog converter.

5. An analog-to-digital converter as claimed in claim 4 wherein said synchronizing circuit further supplies a clock pulse to said reset switch at the end of a permutation cycle thereby to operate the switch to discharge the integrating capacitor.

6. A digital-to-analog converter comprising:
a current source for generating a plurality of substantially equal output currents,
a permutation circuit coupled to the output of the current source for switching said currents to outputs of the permutation circuit in a permutation cycle that produces a plurality of weighted currents at said outputs having DC components in an accurately defined relationship to each other and with an AC error component determined by any inequality of the currents generated by said current source,
a combining circuit having input means coupled to the outputs of the permutation circuit and an output terminal,
a control circuit responsive to a digital input signal and having an output coupled to the combining circuit to control the operation thereof so that the combining circuit derives an analog output signal at its output terminal as a function of the digital input signal,
an averaging circuit coupled to said output terminal for averaging the analog output signal over an averaging time period equal to the cycle period of the permutation circuit or an integral multiple thereof,
a sampling circuit for sampling an output signal of the averaging circuit at the end of an averaging time period and prior to reset of the averaging circuit, and
a synchronizing circuit coupled to the control circuit, the permutation circuit, the averaging circuit and the sampling circuit to control the operation of said circuits so that said averaging time period corresponds to the cycle period of the permutation circuit or an integral multiple thereof and the combining circuit and the averaging circuit are synchronized so that the setting of the combining circuit is unchanged during an averaging time period.

7. A digital-to-analog converter as claimed in claim 6 wherein said averaging circuit comprises an integrator and said combining circuit includes a plurality of switching devices controlled by the digital input signal via said control circuit, and
the integrator comprises:
an operational amplifier having a first capacitor coupled between its inverting input and its output,
a reset switch connected in parallel with the first capacitor and controlled by the synchronizing circuit,
a second capacitor,
a second switch controlled by the synchronizing circuit,
means coupling one terminal of the second capacitor to a non-inverting input of the operational amplifier,
and means including the second switch for selectively coupling the other terminal of the second capacitor to said output terminal of the combining circuit during the averaging time period and to said inverting input of the operational amplifier at the end of an averaging time period.

8. An analog-to-digital converter comprising:
a digital-to-analog converter based on the dynamic permutation principle and having an input terminal for receiving a digital input signal and an output terminal for deriving an analog output signal having an AC error component having a mean value of zero over a time period equal to the permutation cycle of the digital-to-analog converter,
a source of analog signal current to be converted coupled to said digital-to-analog converter output terminal,
a comparator having an input and an output, an integrating capacitor and a reset switch connected in parallel and coupled to the digital-to-analog converter output terminal and to said comparator input, said digital-to-analog converter including a synchronizing circuit for supplying control pulses to the comparator and to the reset switch, and a digital signal generator coupled between the output of the comparator and said input terminal of the digital-to-analog converter so as to successively change the digital input signal to the digital-to-analog converter as a function of the comparator output until the digital signal input to the digital-to-analog converter closely approximates the value of the analog signal current.

* * * * *